United States Patent [19]

Seiichiro

[11] Patent Number: 4,848,006

[45] Date of Patent: Jul. 18, 1989

[54] SPIN DRIER FOR SEMICONDUCTOR MATERIALS

[76] Inventor: Aigo Seiichiro, 3-15-13, Negishi, Daito-ku, Tokyo, Japan

[21] Appl. No.: 192,573

[22] Filed: May 11, 1988

[30] Foreign Application Priority Data

May 11, 1987 [JP] Japan ................. 62-69835[U]

[51] Int. Cl.$^4$ .......................................... F26B 17/30
[52] U.S. Cl. .................................. 34/58; 34/184
[58] Field of Search ................ 34/8, 58, 59, 184

[56] References Cited

U.S. PATENT DOCUMENTS 4,777,732 10/1988 Hirano .................... 34/58

FOREIGN PATENT DOCUMENTS 55-154736 12/1980 Japan .................... 34/58

Primary Examiner—Henry A. Bennett
Assistant Examiner—John Sollecito
Attorney, Agent, or Firm—Wegner & Bretschneider

[57] ABSTRACT

A spin drier comprising a rotating rotor for spin-drying semiconductor materials, in which the rotor is made of aluminum to lessen the weight of the rotor and has therein reinforcing rods fastened between the upper ring and the base plate of the rotor in order to bring higher strength of the rotor. Such arrangements enable a highly accelerated starting in rotation of the rotor. Due to such highly accelerated starting, the spin drier can remove water droplets stuck on wafers completely so as to obviate occurrence of water marks.

4 Claims, 2 Drawing Sheets

SPIN DRIER FOR SEMICONDUCTOR MATERIALS

BACKGROUND OF THE INVENTION (1) Field of the Invention

This invention relates to an improvement in or relating spin drier to remove water droplets stuck on surfaces of semiconductor materials (wafers) by centrifugal force and to dry the same.

(2) Description of the Prior Art

This type of spin drier comprises a casing and a rotor rotated in the casing, and the rotor has usually four air-guides formed of a curved thin plate, said air-guides being mounted on the circular base plate of the rotor. Wafers to be dried are housed in a carrier, the carrier being also housed in a cradle to be set in position between air-guides in the rotor. There is provided a lid on the casing, which lid is positioned above the rotor and has a suction port formed therein, and the peripheral wall of the casing has an exhaust port formed at a suitable position thereof. Centrifugal force due to an acceleration at the starting of rotation of the rotor will scatter away and remove most of water droplets stuck on wafer surfaces, and after the rotary speed of the rotor attains to the specified one, wafers are dried by air stream flowing from the suction port through the central zone in the rotor to along the peripheral wall of the casing and finally to the exhaust port.

Usually, in commonly accepted technique, the rotor which is made of steel rotates at about 1200–1400 rpm. Accordingly, in case of a rotor of 600 mm diameter, the rotor has its weight of about 22 Kg and due to the weight, the acceleration time, namely the time to attain to the specified speed at the starting, requires about 20 seconds. In case that there is extremely small quantity of water droplets stuck on wafer surfaces, surface tension and adhesion of water droplets are larger than centrifugal force of the same. Thus, such acceleration time (rising time to the specified speed) of 20 seconds cannot remove the described small quantity of water droplets, which results in occurrence of water marks. Occurrence of water marks will cause natural oxidization which leads to deterioration in acid-proof characteristics. And, this lowers the rate of yield and thus raises production costs.

SUMMARY OF THE INVENTION

Therefore, an object of the invention is to solve the aforementioned drawbacks and problems of the prior art and thus to provide an improved spin drier in which an excellent rising time, i.e. a short acceleration time is obtainable to remove water droplets completely so as to prevent semiconductor materials from causing water marks.

For attaining the above object, a spin drier according to the present invention comprises a casing, a rotor rotated therein and four air-guides formed of a curved plate and mounted on the base plate of rotor, a carrier in which semiconductor materials are housed being adapted to be set in a space between the air-guides with a cradle in which the carrier is housed, and has features in which the base plate of the rotor is made of Al (Aluminum) in order to lessen the weight of the rotor, and each zone on the rotor surrounded by the air-guides is provided with a pair of reinforcing rods which are fastened between the outer peripheral portion of the rotor and upper ring above the base plate with crossing each other, and said each zone also includes at least another reinforcing rod which is directed approximately radially and secured at its upper end to the upper ring and at its lower end to the base plate of the rotor to have enough strength for a highly accelerated rotation.

This rotor is of light-weight due to the Al-made base plate of the rotor, and is of high strength endurable against any radial as well as circumferential forces due to reinforcing rods in the zone of each air-guide. This allows a high speed rotation and a highly accelerated rotation of the rotor, so that the acceleration time can be shortened, as an example, to 7 seconds, while the prior art one requires 20 seconds. Therefore, in the acceleration time, the spin drier can remove water droplets stuck on wafer surfaces completely to thereby obviate occurrence of water marks.

DETAILED DESCRIPTION OF THE INVENTION AND THE PREFERRED EMBODIMENTS

Figure 2:
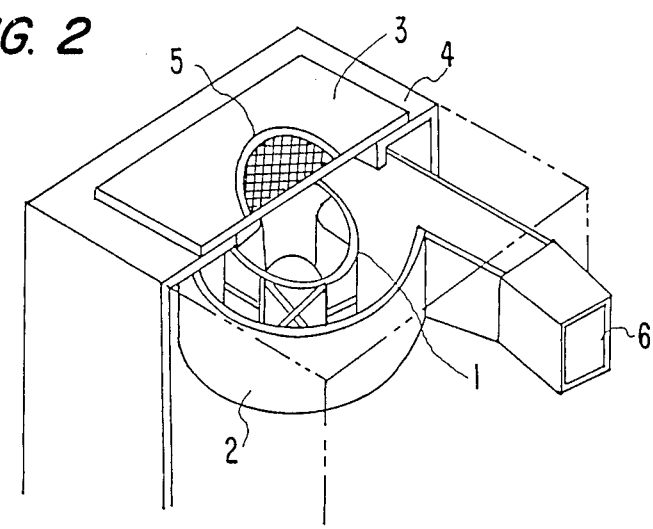
FIG. 2 is a perspective view showing the entirety of the spin drier.

The invention will now be described with reference to the preferred embodiments. In FIG. 2 which shows the entire structure of this type of spin drier, 1 denotes the rotor of the spin drier, and 2 denotes a casing surrounding the rotor. A lid 3 is disposed on the casing 2 and above the rotor 1. These members are housed in an outer case 4. Lid 3 is formed at its central area with a suction port 5 provided with an air filter. The peripheral wall of the casing 2 has an exhaust port 6 formed at a suitable position thereof. Although the Figure does not show any drive means, the base plate 10 of the rotor 1 is coupled at the center thereof with a shaft which is driven by an electric motor.

One of the features of the spin drier according to the invention is in that the base plate 10 of the rotor 1 is made of Al in order to lessen the weight of the rotor 1, and another feature of the invention is to provide reinforcing rods fastened between the base plate 10 and an upper ring 11 of the rotor 1.

Figure 1:
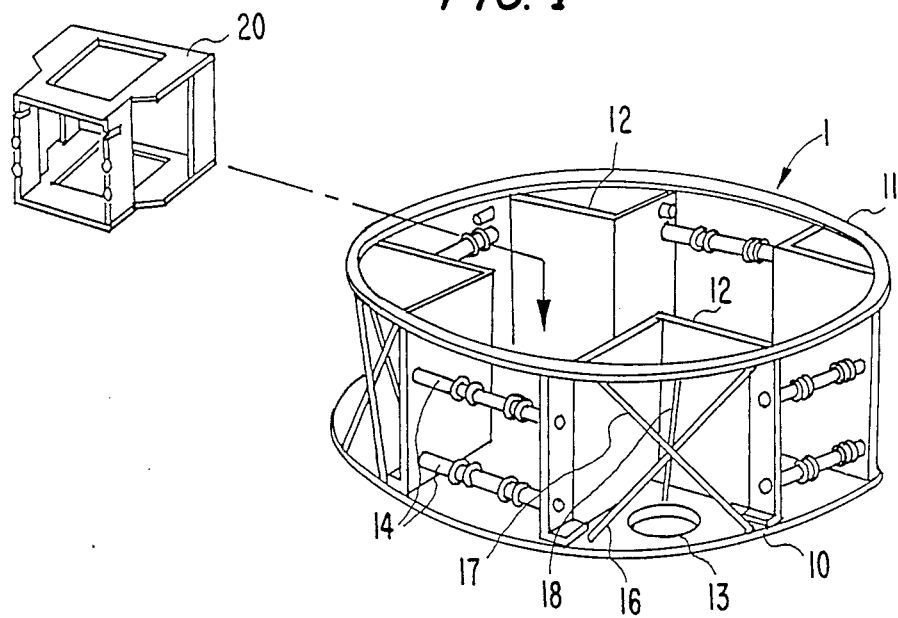
FIG. 1 is a perspective view of a rotor as an example used for the spin drier according to the invention.
Figure 3:
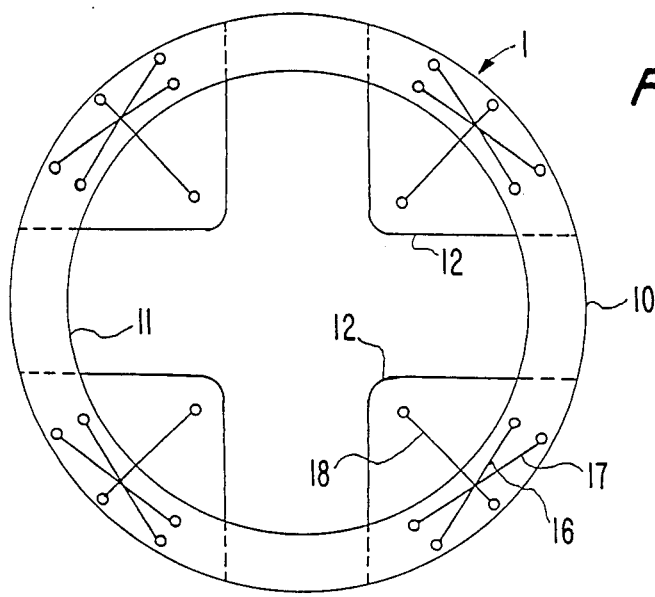
FIG. 3 is a plan view of an example of the rotor used for the spin drier according to the invention.

As shown clearly in FIG. 3, this rotor 1 has four equally spaced air-guides 12 mounted therein, and each group of reinforcing rods are positioned in a zone surrounded by the air-guide 12. The respective air-guides are formed of a curved plate. A cradle in which a carrier for wafers is housed will be positioned between the air-guides 12. As shown in FIG. 1, each area of the rotor base plate 10 surrounded by the respective air-guides 12 is preferably formed with an opening 13 through which downward air flow will be effected. Also, the rotor 1 includes holder rods 14 shown in FIG. 1, which serve to restrain a cradle 20 and a carrier (not shown) housed in the cradle.

Figure 4:
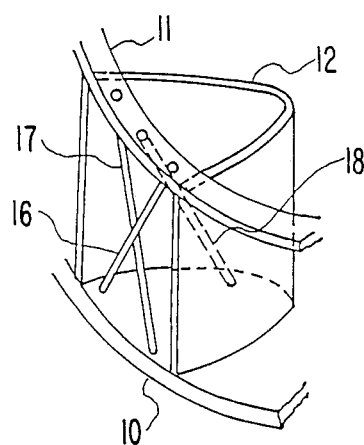
FIG. 4 is a perspective view of a portion of the rotor shown in FIG. 3.

As the described reinforcing rods, four groups of them are provided in the rotor 1 with respect to four air-guides, one group of reinforcing rods being within one air-guide 12. And, as shown in FIG. 4, each group of reinforcing rods includes at least three reinforcing rods, a pair 16,17 of them being crossing each other and fastened between the outer peripheral portion of the base plate 10 and the upper ring 11 of the rotor 1, and another reinforcing rod 18 being directed approximately radially and secured at its upper end to the upper ring 11 and at its lower end to the base plate 10 of the rotor 1. A plurality of such reinforcing rods 18 will be desirably provided.

Figure 5:
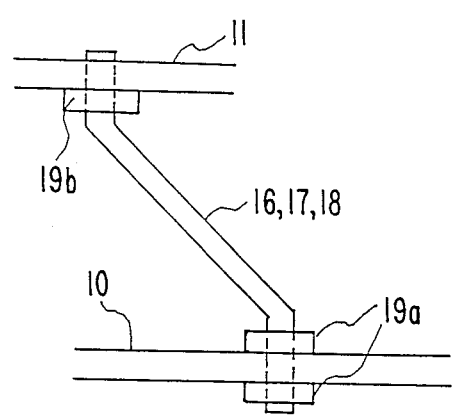
FIG. 5 is an enlarged elevational view of a detailed portion of the rotor shown in FIG. 3.

The respective air-guides 12 are preferably made of aluminium for further lessening the weight of the rotor. On the other hand, the respective reinforcing rods 16, 17 and 18 are preferably made of steel in view of its higher strength. In case of steel reinforcing rods, the rods will be secured at both ends by means of screw-threaded engagement, that is, as shown in FIG. 5, both end portions of the reinforcing rods are formed with screw-thread, and are respectively engaged with a nut 19a, 19b secured on the rotor base plate 10 and the upper ring 11. Thus, the pair of reinforcing rods 16 and 17 are of enough strength against circumferential load on the rotor, and another reinforcing rod 18 renders the rotor 10 durable enough against a radial load on the rotor.

In operation, at starting of rotation, i.e. in the acceleration time of the rotor 1, water droplets stuck on wafers are scattered away from the rotor, and due to the rotation of the rotor 1, air introduced through the suction port 5 into the rotor 1 is guided by the air-guides 12 and flows radially outwards through cradles 20 set between the guides to along the peripheral wall of the casing 2, and is discharged through the exhaust port 6. Such air flow drys wafers set in the rotor.

With the arrangement described above, since the spin drier of the present invention has a light-weight rotor, a highly accelerated starting, that is, a short time acceleration time in rotation of the rotor is attained. For example, the acceleration time in our spin drier is about 7 seconds, while the conventional one requires 20 seconds. Then, the reinforcing rods render the rotor durable enough for such highly accelerated starting. Accordingly at the starting this spin drier can remove water droplets stuck on wafers completely so as to obviate occurrence of water marks. Therefore, this overcomes the problem of natural oxidation and leads to a higher rate of yield.

Having now fully described the invention, it will be apparent to one of ordinary skill in the art that many changes and modifications can be made thereto without departing from the spirit or scope of the invention as set forth herein.

What is claimed is:

1. In a spin drier for semiconductor materials, which comprises a casing, a rotor to be rotated in the casing and four air-guides formed of a curved plate and mounted on the base plate of the rotor, a carrier in which semiconductor materials to be dried are housed being adapted to be set in a space between the air-guides with a cradle in which said carrier is housed, the improvement wherein said base plate of the rotor is made of aluminium in order to lessen the weight of the rotor, and each zone surrounded by the air-guides in the rotor being provided with a pair of reinforcing rods which are crossing each other and fastened between the outer peripheral portion of the base plate and upper ring of the rotor, and said each zone also including at least another reinforcing rod which is directed approximately radially and secured at its upper end to said upper ring and at its lower end to the base plate of the rotor.

2. A spin drier set forth in claim 1, wherein each area of the rotor base plate surrounded by the respective air-guides is formed with an opening through which air flows.

3. A spin drier set forth in claim 1, wherein the respective air-guides are made of aluminium so as to further lessen the weight of the rotor.

4. A spin drier as set forth in claim 1, wherein the respective reinforcing rods are made of steel and secured at both ends to the upper ring and the base plate of the rotor by means of screw-threaded engagement.

* * * * *

UNITED STATES PATENT AND TRADEMARK OFFICE
CERTIFICATE OF CORRECTION

PATENT NO. : 4,848,006

DATED : July 18, 1989

INVENTOR(S) : Seiichiro Aigo

It is certified that error appears in the above-identified patent and that said Letters Patent is hereby corrected as shown below:

Cover page, correct the inventor's name from "Aigo Seiichiro" to --Seiichiro Aigo--.

Signed and Sealed this

Fifteenth Day of May, 1990

Attest:

HARRY F. MANBECK, JR.

*Attesting Officer*     *Commissioner of Patents and Trademarks*